United States Patent [19]

Kondoh et al.

[11] Patent Number: 4,689,514

[45] Date of Patent: Aug. 25, 1987

[54] DISPLACEMENT GENERATING DEVICE

[75] Inventors: You Kondoh, Yokohama; Chiaki Tanuma, Tokyo, both of Japan

[73] Assignee: Kabushiki Kaisha Toshiba, Kawasaki, Japan

[21] Appl. No.: 853,199

[22] Filed: Apr. 17, 1986

[30] Foreign Application Priority Data

Jun. 10, 1985 [JP] Japan .................................. 60-125675

[51] Int. Cl.⁴ ............................................ H01L 41/08
[52] U.S. Cl. .................................... 310/316; 310/317; 310/332; 360/75
[58] Field of Search ................. 310/316, 317, 330–332; 318/116, 118; 360/75–77, DIG. 1, 107, 109

[56] References Cited

U.S. PATENT DOCUMENTS

| | | | |
|---|---|---|---|
| 3,879,698 | 4/1975 | Pepper | 310/317 X |
| 3,916,226 | 10/1975 | Knoll | 310/317 |
| 4,237,399 | 12/1980 | Sakamoto | 310/317 |
| 4,259,605 | 3/1981 | Rijckaert | 310/317 |
| 4,263,527 | 4/1981 | Comstock | 310/316 |
| 4,395,741 | 7/1983 | Kobayashi et al. | 310/317 X |
| 4,513,334 | 4/1985 | Otsuka | 310/317 X |
| 4,514,773 | 4/1985 | Süsz | 310/317 X |
| 4,594,526 | 6/1986 | Araki et al. | 310/317 |

OTHER PUBLICATIONS

Electronics Letter May 27, 1982, vol. 18, No. II "Improving the Linearity of Piezoelectric Activators" C. V. Newcomb, J. Flinn.

Primary Examiner—Mark O. Budd
Attorney, Agent, or Firm—Oblon, Fisher, Spivak, McClelland & Maier

[57] ABSTRACT

In a displacement generating device, a voltage signal generator produces a triangular-wave drive voltage signal so as to drive a piezoelectric element in a desired vibration mode. The voltage signal generator is connected to the piezoelectric element through a differentiator and a constant current supply. The drive voltage signal is differentiated by the differentiator, and is then supplied as a rectangular-wave voltage signal to the constant current supply. Since constant currents having two levels are alternately supplied to the piezoelectric element, an amount of charge accumulated in the piezoelectric element can be controlled linearly during the current supply time. As a result, since displacement of the piezoelectric element is linearly controlled in proportion to the amount of charge, it coincides with the triangular waveform of the drive voltage signal. A vibration mode free from hysteresis can be obtained.

16 Claims, 28 Drawing Figures

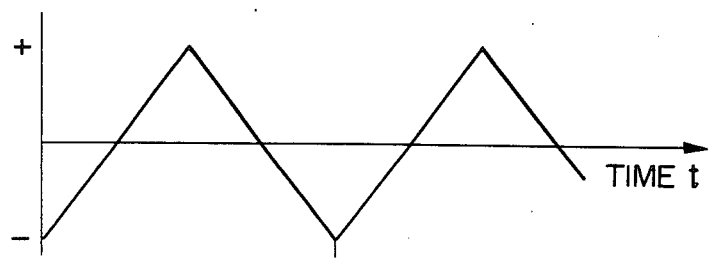
F I G. 2A
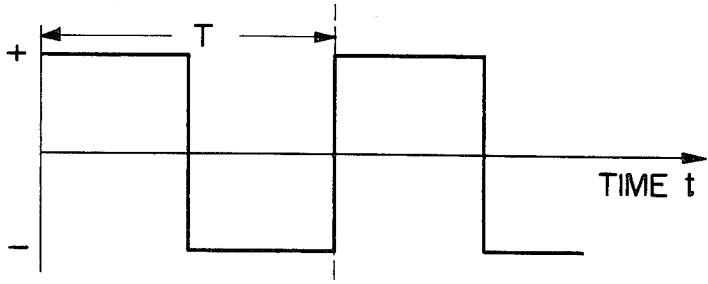
F I G. 2B
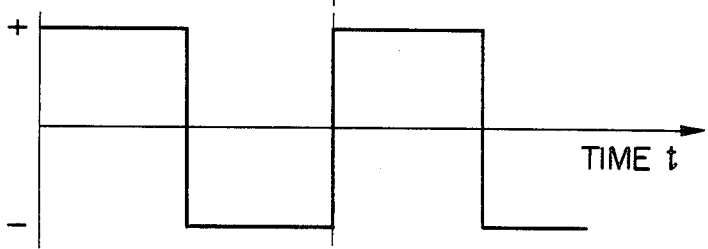
F I G. 2C
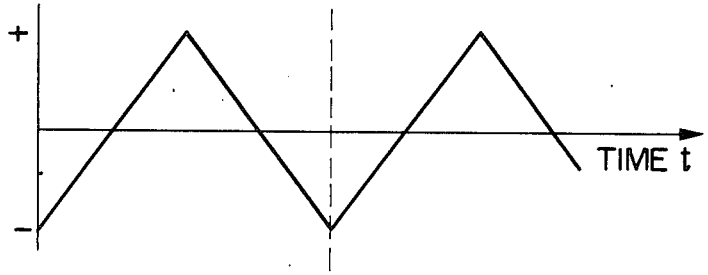
F I G. 2D
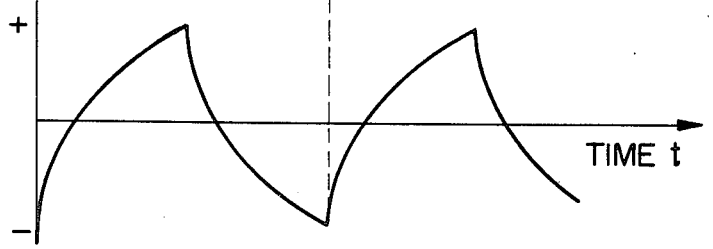
F I G. 2E F I G. 5
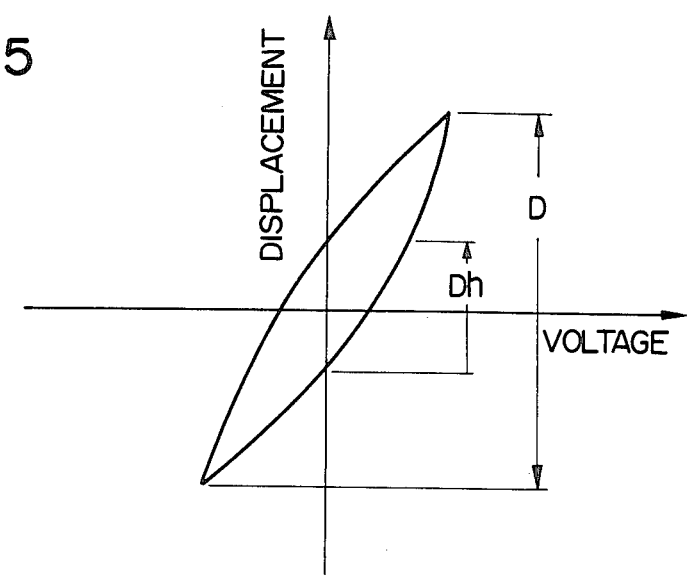
F I G. 6
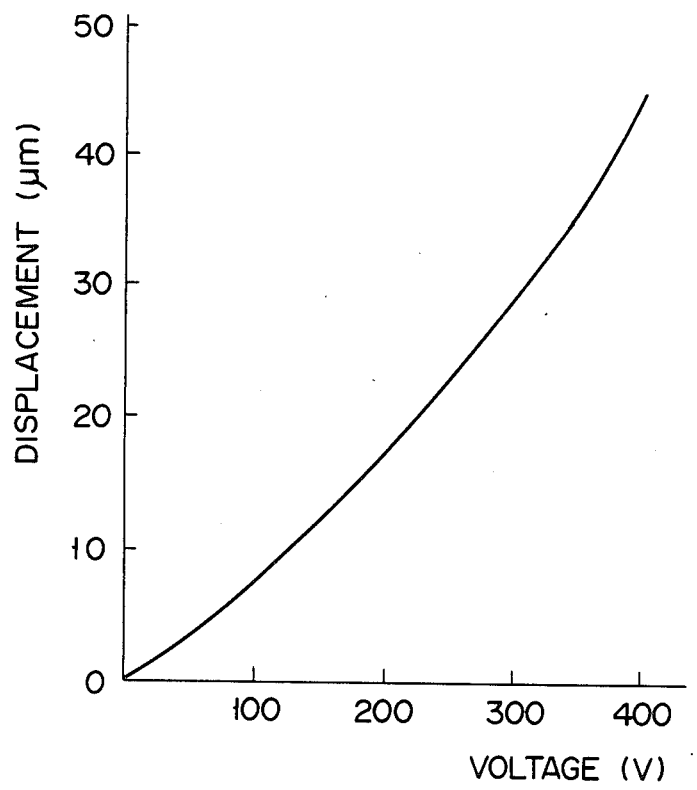

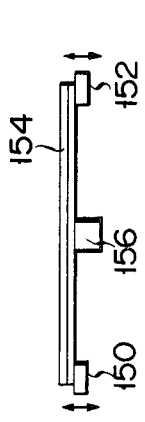
F I G. 12
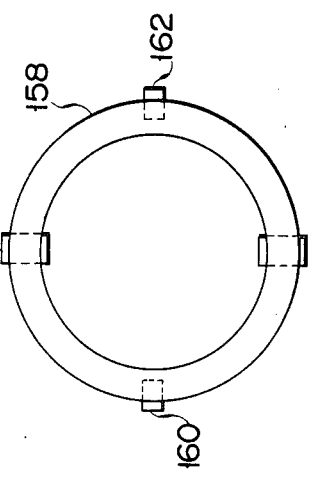
F I G. 13A
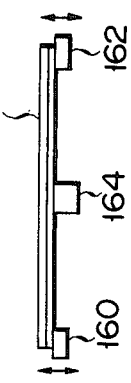
F I G. 13B
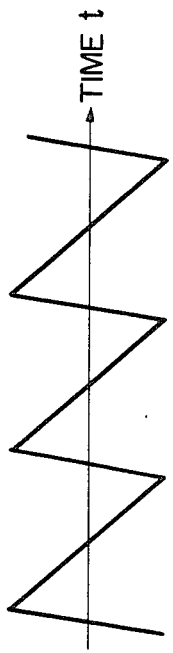
F I G. 11A
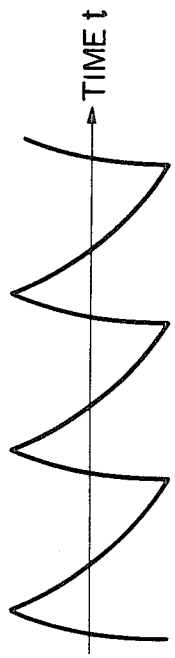
F I G. 11B
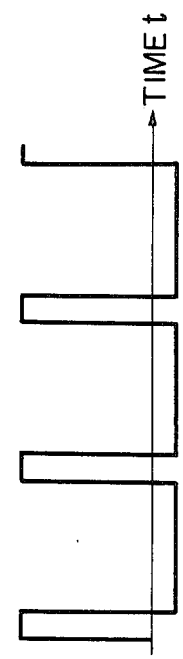
F I G. 11C

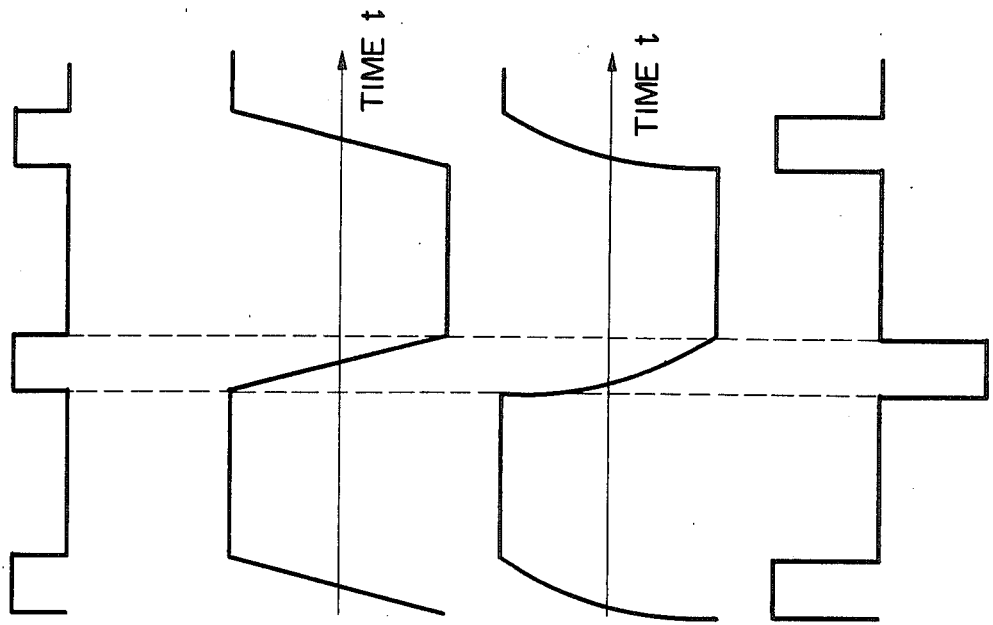
FIG. 17A
FIG. 17B
FIG. 17C
FIG. 17D
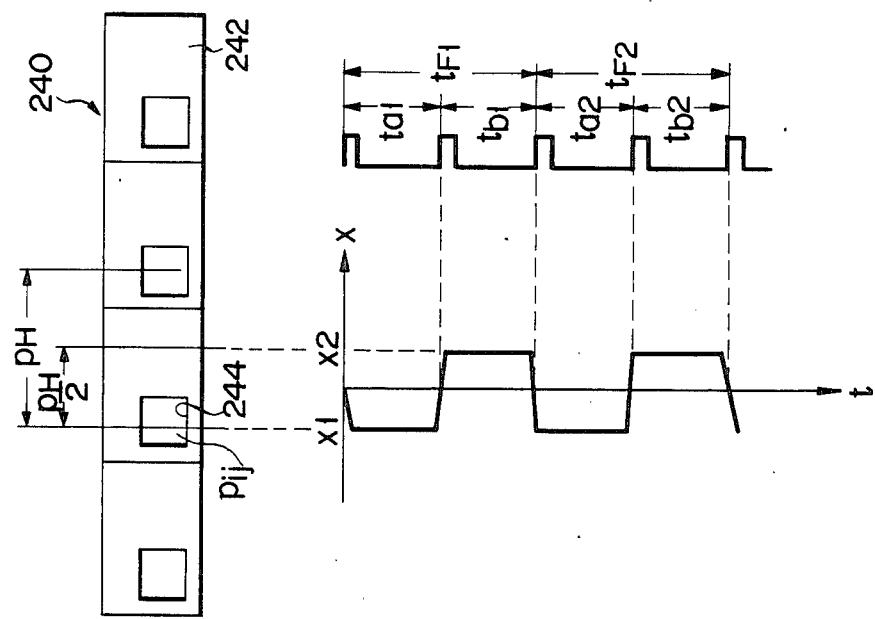
FIG. 16

DISPLACEMENT GENERATING DEVICE

BACKGROUND OF THE INVENTION

The present invention relates to a displacent generating device and, more particularly, to a device for generating small, periodic displacements using an actuator comprising a piezoelectric element so as to successively displace the position of an object.

In a "reverse piezoelectric effect" known to those skilled in the art, a piezoelectric body is deformed in accordance with supplied electrical energy such as a voltage. When an AC voltage signal, which has a periodically changing voltage level, is applied, the extent of deformation of the piezoelectric body (i.e., the amount of displacement) also changes periodically. Thus, the piezoelectric body generates repetitive mechanical displacement (i.e., vibration). By using this principle, a piezoelectric element is used as an actuator in order to displace or vibrate a small object. A piezoelectric actuator has many advantages: it is compact, light weight, has a high response speed and low power consumption, generates no heat during vibration, has no adverse effects on peripheral circuits, and so on. Therefore, when the position of an object must be precisely set on the order of microns or submicrons, a piezoelectric actuator is widely adopted. For example, when a small chip (e.g., a magnetic head of a VTR) incorporated in high-precision electronic equipment is to be position controlled accurately or vibrated in a desired mode, a piezoelectric actuator is preferably used. Since a circuit for driving the piezoelectric actuator is relatively simple, it can be easily installed in a small space in highly integrated electronic equipment.

However, a piezoelectric actuator having the excellent characteristics described above suffers from a certain problem: it exhibits hysteresis characteristics in a displacement generation mode. More specifically, amounts of displacement produced at the same voltage level differ when a voltage applied to the piezoelectric actuator increases or decreases. In this case, hysteresis H (%) is expressed by:

$$H = (DH/D) \times 100$$

where
- DH: a difference between a residual amount of displacement generated in the piezoelectric actuator when an application voltage increases to zero, and that when it decreases to zero; and
- D: a maximum magnitude of the amount of displacement.

The fact that the piezoelectric actuator has the hysteresis characteristics means that amount of displacement of the piezoelectric actuator changes nonlinearly with respect to an application voltage. In other words, when a linearly changing drive voltage (e.g., a triangular wave voltage) is applied to the piezoelectric actuator, its actual amount of displacement changes nonlinearly. Therefore, the application voltage cannot have proportional, one-to-one correspondence with the amount of displacement of the piezoelectric actuator. As a result, an object mounted on the piezoelectric actuator cannot be precisely aligned. If an object is vibrated between two points using a piezoelectric actuator, a moving speed of the object between the two points changes because of the hysteresis characteristics, and a vibration pattern with ideal linear characteristics cannot be obtained.

In order to compensate for the hysteresis characteristics of a piezoelectric actuator as above, a level of the application voltage itself must be precisely controlled to compensate for an increase or decrease in the amount of displacement of the piezoelectric actuator, with respect to a constant application voltage. For example, in a conventional method, an increase or a decrease in the amount of displacement caused by the hysteresis characteristics of the piezoelectric actuator is detected in real time by a sensor, and the drive voltage level is precisely controlled in a feedback manner to compensate for the change in amount of displacement each time it is detected. However, since such closed loop voltage control for compensation of the hysteresis characteristics requires a feedback circuit including a sensor, its response time is not greatly improved. In order to improve this response time, the circuit configuration must be complicated, and it cannot be installed in highly integrated electronic equipment, resulting in a limited range of application for such a piezoelectric actuator.

SUMMARY OF THE INVENTION

It is therefore an object of the present invention to provide a displacement generating device which can effectively compensate for hysteresis characteristics of a piezoelectric actuator.

In a displacement generating device according to the present invention, a voltage generator is provided for producing a drive voltage whose voltage level changes to define a vibration mode of a piezoelectric element. A current control unit is connected to the voltage generator and the piezoelectric element. The current control unit receives the drive voltage and produces a current signal, which is then supplied to the piezoelectric element. The current signal has a waveform, including a constant current source waveform component, which changes an amount of charge accumulated in the piezoelectric element in a change mode which coincides with a change in voltage level of the drive voltage. As a result, the amount of displacement generated in the piezoelectric element changes to correspond with the waveform of the drive voltage, and is thus free from the hysteresis characteristics. Thereby, the above object is achieved.

BRIEF DESCRIPTION OF THE DRAWINGS

The present invention is best understood by reference to the accompanying drawings, in which:

FIGS. 2A to 2E are waveform charts showing the waveforms of signals generated in the main part of the device of FIG. 1;

FIG. 5 is a graph showing hysteresis characteristics normally generated in a vibrating piezoelectric actuator;

FIGS. 6 to 8 are graphs showing various results of tests conducted using the circuit in FIG. 3;

FIGS. 11A to 11C are waveform charts showing the waveforms of signals generated in the main part of the device installed in the VTR of FIG. 9;

FIGS. 12 and 12A and 13B are sectional views showing modifications of a piezoelectric actuator which drives a magnetic head;

FIG. 16 is an illustration for explaining a swing image sensing mode of the device in FIG. 15; and FIGS. 17A to 17D waveform charts showing the waveforms of signals generated in the main part of the device installed in the image sensing device of FIG. 14.

DETAILED DESCRIPTION OF THE PREFERRED EMBODIMENT

Figure 1:
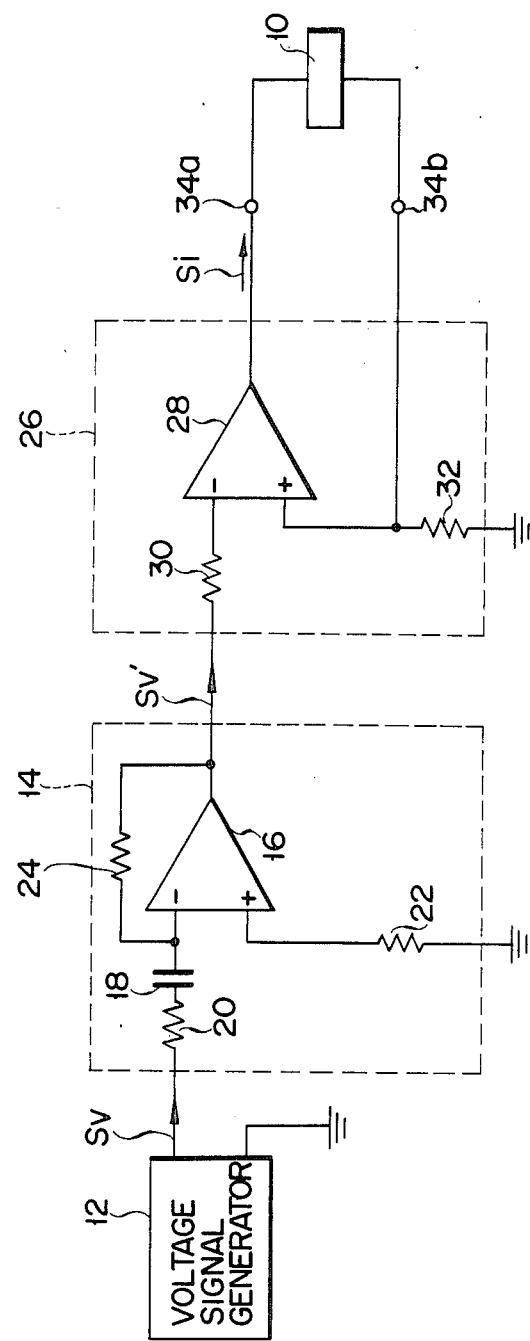
FIG. 1 is a circuit diagram showing a main part of a displacement generating device according to a preferred embodiment of the present invention.

A basic arrangement of a displacement generating device according to one preferred embodiment of the present invention will be explained with reference to FIG. 1. Referring to FIG. 1, piezoelectric element 10 may comprise a bimorph or multilayered piezoelectric element, and produces displacement which changes periodically in accordance with a voltage waveform when a drive voltage with a periodically changing voltage level is applied thereto. When the waveform of the drive voltage is appropriately selected, element 10 can be vibrated in a desired vibration mode. When a relatively small object (such as a small chip) is mounted on element 10, element 10 can serve as an actuator for displacing, vibrating or swinging the object.

Voltage signal generator 12 generates drive voltage signal Sv necessary for periodically displacing (i.e., vibrating) element 10 in the desired mode. The output terminal of generator 12 is connected to differentiator 14, which includes operational amplifier 16. The inverting input terminal (indicated by "−" in FIG. 1) of amplifier 16 is connected to one output terminal of generator 12 through capacitor 18 and resistor 20. The other output terminal of generator 12 is grounded. The non-inverting input terminal (indicated by "+" in FIG. 1) of amplifier 16 is grounded through resistor 22. The output terminal of amplifier 16 is fed back to the inverting input terminal thereof through resistor 24. With this arrangement, when signal Sv is supplied from generator 12 to differentiator 14, differentiator 14 differentiates the input signal to produce differentiated voltage signal Sv'.

Differentiator 14 is connected to constant current supply 26 which includes operational amplifier 28. The output terminal of amplifier 16 in differentiator 14 is connected through resistor 30 to operational amplifier 28 included in current supply 26. Therefore, signal Sv' generated from differentiator 14 is supplied to the inverting input terminal of amplifier 28. The non-inverting input terminal of amplifier 28 is grounded through resistor 32. The non-inverting input terminal and the output terminal of amplifier 28 correspond to output terminals 34a and 34b of current supply 26, respectively. Piezoelectric element 10 is connected to output terminals 34a and 34b.

The operation of the displacement generating device with the above arrangement when piezoelectric element 10 is vibrated with a given cycle will be described with reference to FIGS. 2A to 2E.

As shown in FIG. 2A, generator 12 produces an AC signal having a triangular waveform. When drive voltage signal Sv having the triangular waveform is supplied to differentiator 14, differentiator 14 differentiates signal Sv to produce voltage signal Sv' having a rectangular waveform shown in FIG. 2B. More specifically, while the potential of signal Sv increases linearly, the output signal from differentiator 14 is maintained at high (first) potential level. Similarly, while the potential of signal Sv decreases linearly, the output signal from differentiator 14 is maintained at low (second) potential level. As is known to one skilled in the art, a cycle of voltage signal Sv will not change before and after the differentiation processing.

When rectangular-waveform signal Sv' shown in FIG. 2B is supplied to operational amplifier 28 of current supply 26, current Si having the same phase as voltage Sv' appears at output terminal 34a of current supply 26. This is because amplifier 28 is an operational input type amplifier which is operated such that the inverting and non-inverting input terminals thereof are at the same potential. Thus when differentiated voltage signal Sv' is supplied from differentiator 14 to the inverting input terminal of amplifier 28, a rectangular voltage signal having the same phase as the input signal appears at the non-inverting input terminal thereof. In other words, current Si has a rectangular waveform including a constant current component having a first (positive) current value while the voltage of signal Sv increases linearly, and having a second (negative) current value while it decreases linearly (FIG. 2C).

Rectangular-wave current Si is supplied as a drive current signal to piezoelectric element 10 through output terminal 34a. Current Si flows through element 10, and is then fed back to the non-inverting input terminal of amplifier 28 through output terminal 34b. More specifically, while signal Sv increases linearly, constant positive current is supplied to element 10. While signal Sv decreases linearly, a constant negative current is supplied to element 10. Since an input impedance of amplifier 28 can generally be considered to be infinite, current Si fed back from element 10 flows to ground through resistor 32. At this point, since the voltage appearing across two ends of resistor 32 is equal to the input voltage signal of current supply 26, i.e., differentiated voltage Sv', the waveform of signal Sv' coincides with that of signal Si. The amplitude of current Si is thus proportional to that of signal Sv' from differentiator 14.

When current Si is supplied to element 10, element 10 successively vibrates in a predetermined vibration mode, according to the current waveform shown in FIG. 2D. In this case, the amplitude of the vibration of element 10 is proportional to a peak-to-peak current value of current Si from current supply 26. When a change in voltage appearing across output terminals 34a and 34b of current supply 26 was measured using a known voltage measuring device, a voltage having a modified pseudo triangular waveform shown in FIG. 2E was observed. Although the pseudo triangular waveform has the same cycle as that of signal Sv from generator 12 in period T, it changes curvilinearly. More specifically, while the potential of signal Sv increases linearly, the potential of the voltage appearing across output terminals 34a and 34b of current supply 26 increases in the form of a projected curve. Similarly, while the potential of signal Sv decreases linearly, the potential of the voltage appearing across output terminals 34a and 34b of current supply 26 decreases in the form of a recessed curve.

When element 10 using the above circuit arrangement was vibrated under current control, it was confirmed that it vibrated in a clear linear mode without exhibiting any hysteresis characteristics. In other words, if a drive circuit adopting the current control concept of the present invention is used, a drive voltage signal whose potential is adjusted (increased or decreased) to completely compensate for the hysteresis characteristics of element 10 can be obtained. As a result of the above test, element 10 generated desired displacement with substantially completely linear characteristics.

Since a circuit arrangement necessary for effectively compensating for the hysteresis characteristics of element 10 has a simple circuitry, consisting basically of differentiator 14 and current supply 26, it can be rendered very compact when compared with a conventional feedback compensation circuit including a sensor (see Background of the Invention of this specification). Therefore, it can be easily installed in a small space in highly integrated electronic equipment (e.g., a home-use VTR, high-resolution video camera, etc., to be described later) together with the object for forming an actuator. Therefore, the drive circuit of this invention will be a boon to manufacturers who produce such high-precision equipment using piezoelectric elements.

The reason that the vibration pattern of element 10 accurately coincides with the waveform of voltage signal Sv, first produced from generator 12 when the drive circuit of this invention is used, will now be explained. Since a piezoelectric element comprises a piezoelectric plate sandwiched between two electrode plates, it can be considered to be a capacitor in an equivalent circuit. When a drive voltage is applied to actuator 10, charge amount Q accumulated in actuator 10 is expressed by the following equation:

$$Q = i \cdot dt \quad (1)$$

where
i: a current flowing through the piezoelectric actuator; and
t: current supply time to the actuator.
In equation (1), if "i" is constant or fixed value Ic, charge amount Q accumulated in actuator 10 can be defined as:

$$Q = Ic \cdot t \quad (2)$$

Therefore, if the drive current supplied to actuator 10 is rendered constant (i.e., the current level is kept unchanged in a DC manner upon supply of current), as shown in FIG. 2C, charge amount Q accumulated in actuator 10 is linearly proportional to a supply time of the current flowing through actuator 10. On the other hand, since displacement amount D of actuator 10 is proportional to charge amount Q accumulated therein, the displacement of actuator 10 can provide linear characteristics free from the hysteresis characteristics (for details, see: C. V. Newcomb et al., "IMPROVING THE LINEARITY OF PIEZOELECTRIC CERAMIC ACTUATORS", Electronics Letters 27th Mat, Vol. 18, No. 18 (1982), pp. 442–444).

Figure 3:
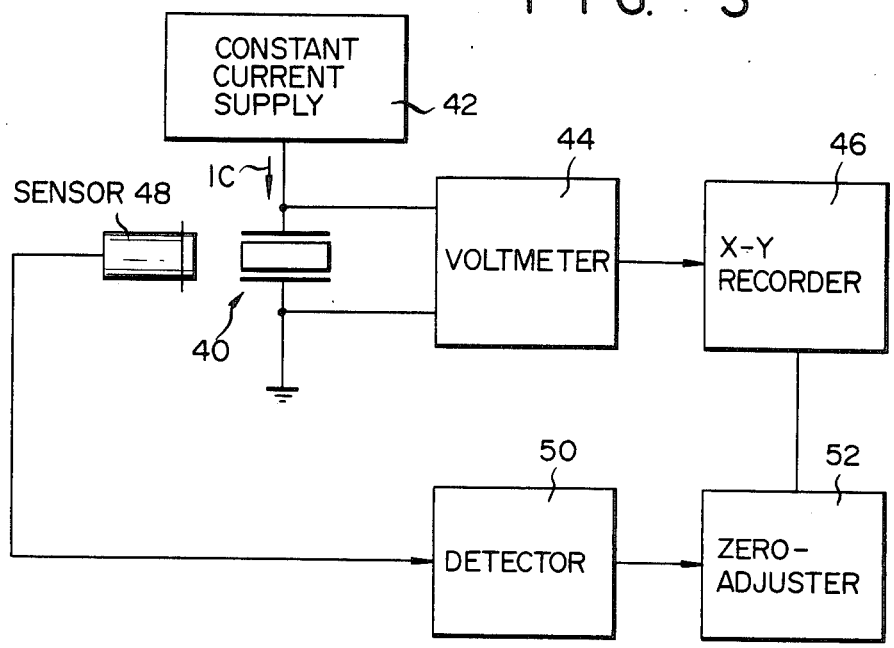
FIG. 3 is a block diagram showing a schematic arrangement of a measurement circuit used when a test was conducted to demonstrate the fact that hysteresis characteristics of a piezoelectric actuator can be removed when it is driven using a constant current source.

In order to demonstrate the fact that displacement amount D generated in a piezoelectric actuator is proportional to charge amount Q accumulated therein (i.e., the linear relationship between them), the present inventors conducted the following test using the measurement circuit shown in FIG. 3. In the measurement circuit of FIG. 3, multilayered piezoelectric actuator 40 was adopted. FIG. 3 equivalently illustrates element 40 as a capacitor. Constant current supply 42 supplies constant current Ic to element 40. Voltmeter 44 measures a change in voltage appearing across two ends of element 40, and supplies a measurement signal to X-Y recorder 46. X-Y recorder 46 records the measurement result from voltmeter 44. Position sensor 48 is provided adjacent to element 40. Sensor 48 detects displacement of element 40 in real time, and produces a detection signal. The detection signal is supplied through detector 50 to zero-adjuster 52, which is connected to recorder 46.

Figure 4:
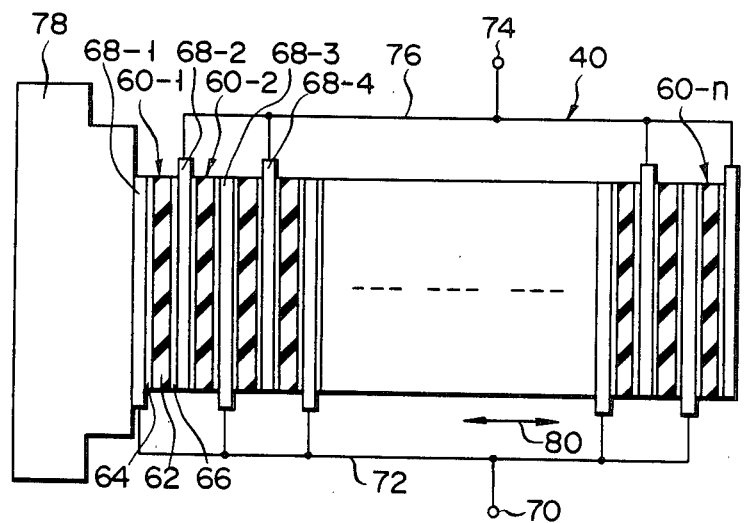
FIG. 4 is a sectional view of a multilayered piezoelectric actuator actually used in the circuit of FIG. 3.

FIG. 4 illustrates a cross-sectional structure of element 40 used in the test. Element 40 is constituted by a plurality of piezoelectric elements 60-1, 60-2, 60-3, . . . , 60-n, stacked on each other. Each piezoelectric element has piezoelectric plate 62 and two electrode layers 64 and 66 adhered to two surfaces thereof. In this test, 200 piezoelectric ceramic elements (TOSHIBA CERAMICS CO., LTD. T-96) having a diameter of 10 mm and a thickness of 0.5 mm were stacked as a piezoelectric element. These piezoelectric ceramic elements are polarized in the direction of element thickness, and are stacked so that the polarization directions of two adjacent piezoelectric elements are reversed in relation to each other. Wiring electrode 68 is provided between neighboring piezoelectric elements so as to electrically connect the electrode layers thereof. Every other electrodes 68-1, 68-3, . . . are connected to first terminal 70 through lead wire 72, and remaining electrodes 68-2, 68-4, . . . are connected to second terminal 74 through lead wire 76. One end of multilayered piezoelectric element 40 is mounted on fixing member 78, and the other end is free.

In response to DC voltage application between terminals 70 and 74, piezoelectric element 40 extends or contracts in a direction shown by arrow 80, thus generating displacement. If element 40 is driven normally (i.e., without using a special-purpose circuit), it tends to exhibit hysteresis characteristics during vibration, as shown in FIG. 5. The adverse influence of the hysteresis characteristics has been described in the "Background of the Invention" of this specification.

The relationship between a DC voltage applied to element 40 and an amount of displacement generated therein was measured using the above test circuit. FIG. 6 shows the results of this measurement. In order to set identical conditions in this and the following tests, a current value supplied from current supply 42 to element 40 was fixed at a constant value, and in this state, the amount of displacement generated in element 40 was plotted by X-Y recorder 46 while the application voltage to element 40 was varied. As can be seen from the graph of FIG. 6, displacement of actuator 40 does not exhibit linear characteristics with respect to the application voltage but is changed in the form of a quadric curve. In other words, when the current flowing through element 40 becomes constant, regardless of a change in voltage, the amount of displacement generated in element 40 is proportional to the voltage application level.

Figure 7:
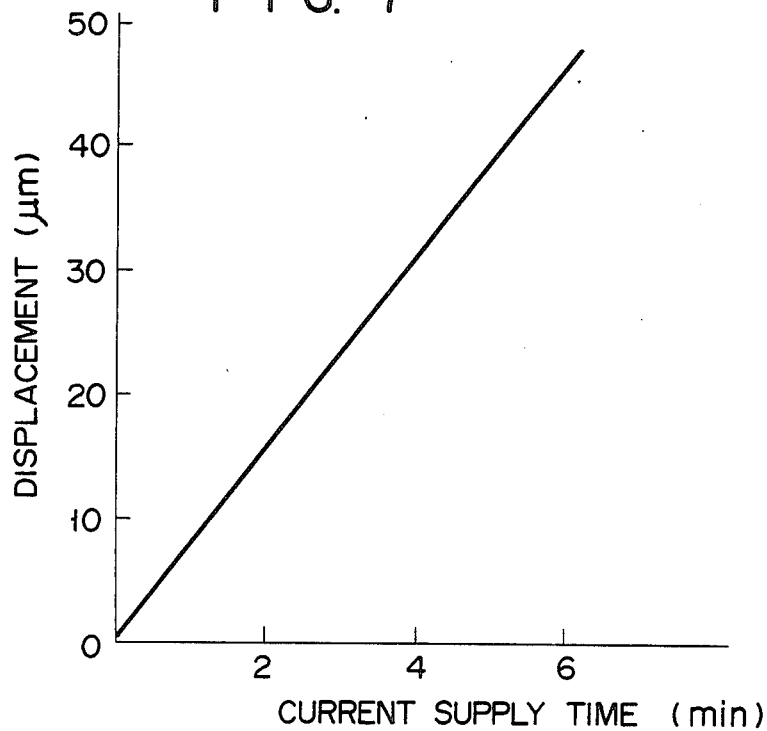

The present inventors measured a change in amount of displacement generated in element 40 over time using X-Y recorder 46 when a constant current was supplied to element 40. FIG. 7 shows the results plotted by recorder 46. The graph reveals that the amount of displacement generated in element 40 is proportional to the constant current supply time thereto, and changes linearly.

Figure 8:
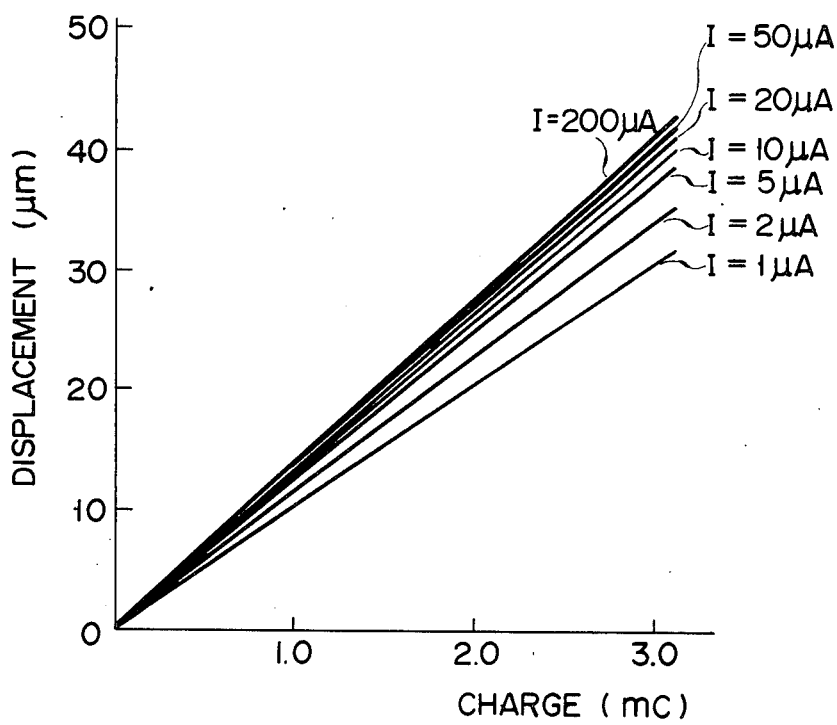

Since it is seen from equation (2) that current supply time t to the piezoelectric element is proportional to charge amount Q accumulated therein, displacement amount D is also proportional to charge amount Q. FIG. 8 experimentally supports the above finding. In this graph, the amount of charge accumulated in piezoelectric element 40 and the amount of displacement generated therein, when a constant current flows therethrough, are plotted using different currents supplied to element 40 as parameters. The lines in FIG. 8 respectively represent linear characteristics when a current supplied to the piezoelectric element is respectively 1 $\mu A$, 2 $\mu A$, 5 $\mu A$, 10 $\mu A$, 20 $\mu A$, 50 $\mu A$, and 200 $\mu A$. As can been seen from FIG. 8, when the constant current is supplied to the piezoelectric element, the amount of charge accumulated therein and the resultant amount of displacement change linearly in proportion to the current supply time. Therefore, the effectiveness of the current control technique of a piezoelectric element according to the present invention may be clearly understood.

Two applications of the displacement generating device according to the embodiment of the present invention will be exemplified below.

Figure 9:
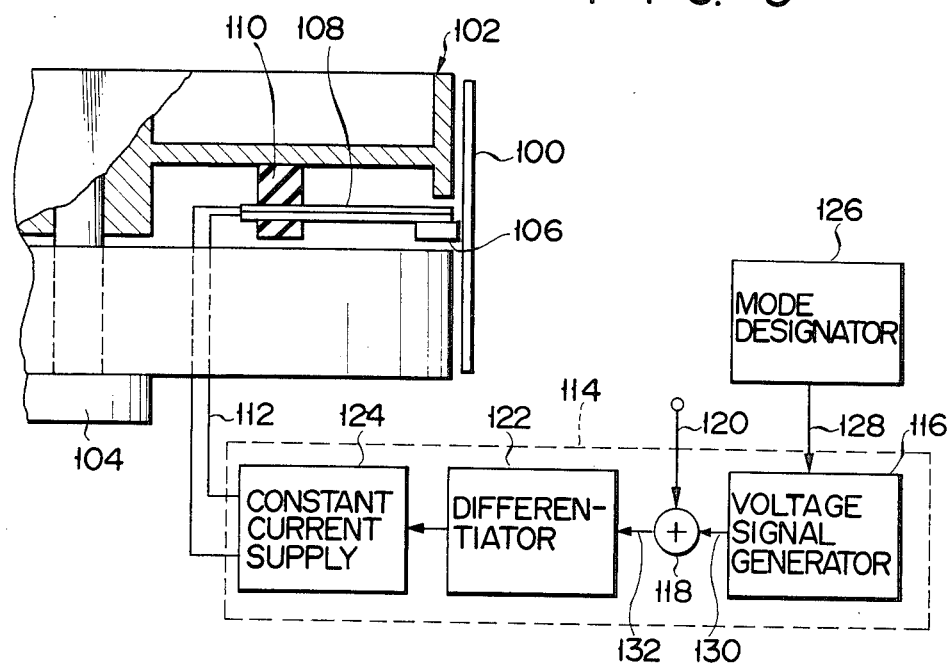
FIG. 9 is a block diagram showing a schematic arrangement of a main part of a helical scan type VTR (first application) incorporating a displacement generating device of the present invention.

FIG. 9 shows a helical scan type video tape recorder (VTR) using the displacement generating device of this invention. In this VTR, a frame image consisting of A and B fields defined according to an NTSC system is recorded or reproduced on or from a magnetic tape in accordance with an azimuth recording method. The VTR allows special reproduction modes (e.g., still reproduction, slow reproduction, double-speed reproduction, high-speed picture search modes, etc.) in addition to normal recording/reproduction modes.

FIG. 9 illustrates an arrangement of a rotative drum portion of this VTR. Magnetic tape 100 runs at a normal speed or a speed corresponding to the selected special reproduction mode (however, in the still reproduction mode, it is stopped). Drum 102 is driven by motor 104 to be rotated helically with respect to magnetic tape 100. Drum 102 has magnetic head 106 on its circumferential surface. Head 106 is not fixed directly to the surface of drum 102, unlike a conventional VTR, but is attached to one end (free end) of piezoelectric actuator 108 comprising a bimorph piezoelectric element. Actuator 108 is installed in drum 102. Actuator 108 is attached at the other end thereof to a fixed portion of drum 102 by support member 110. Therefore, when actuator 108 vibrates, magnetic head 106 is displaced along the surface of drum 102, thereby changing the trace path on tape 100.

Actuator 108 is connected to drive circuit 114 of the present invention through lead wires 112. Drive circuit 114 includes voltage signal generator 116, adder 118 for adding tracking error signal 120 to the output signal from generator 116, differentiator 122, and constant current supply 124. Generator 116 is connected to mode designator 126 to receive therefrom mode designation signal 128, which represents the special reproduction mode (e.g., the still reproduction mode) designated by an operator. Generator 116 supplies to adder 118 triangular-wave voltage drive signal 130 designating the vibration mode. Adder 118 adds to drive voltage signal 130 tracking error signal 120 which represents a shift in angle between an angle of inclination of a field track defined in advance, based on a known recording technique, and the actual tape trace path of head 106, and supplies a sum signal as final drive voltage 132 to differentiator 122.

Differentiator 122 differentiates the waveform of signal 132 and supplies the differentiated signal to constant current supply 124. In response to this signal, current supply 124 supplies a constant current signal to actuator 108. Actuator 108 is then displaced periodically in the direction of thickness of drum 102 along the circumferential surface thereof. In this way, actuator 108 is current controlled by circuit 114 and produces vibration without hysteresis characteristics, as previously described. Consequently, magnetic head 106 fixed to the free end of actuator 108 vibrates along a widthwise direction of the field track defined on tape 100 which runs at a speed corresponding to the designated special reproduction mode.

Figure 10A:
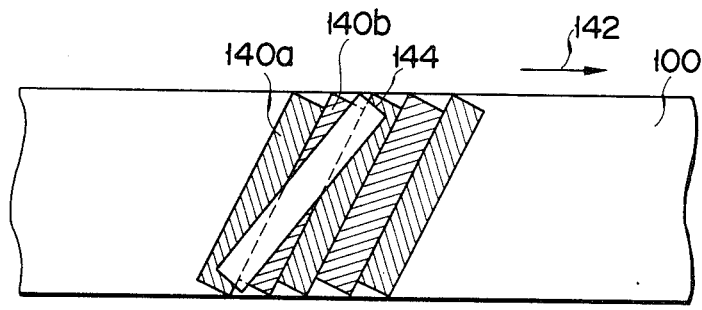
FIGS. 10A and 10B are representations illustrating a shift between a tape trace path of a magnetic head and a field track in two special-purpose reproduction modes of the VTR shown in FIG. 9.

FIG. 10A illustrates an actual trace path of magnetic head 106 with respect to the field track on tape 100 in the slow or still reproduction mode, when head 106 is not vibrated by actuator 108. First and second field tracks (so-called A and B field tracks) 140a and 140b having different azimuth angles are formed on magnetic tape 100. Image (field image) signals magnetically recorded by recording heads (not shown) having azimuth angles corresponding to tracks 140a and 140b represent one frame image. Note that in FIG. 10A, arrow 142 indicates a forward running direction of magnetic tape 100.

When head 106 is directly fixed to drum 102 and when actuator 108 is not used, since a running speed of tape 100 in the slow or still reproduction mode is lower than that in the normal recording/reproduction modes, an angle of inclination of the trace path of head 106 (indicated by area 144 in FIG. 10A) is smaller than that of the field track, as shown in FIG. 10A. For example, when magnetic head 106 has a second (B) azimuth angle, and when it traces only second (B) field track 140b included in each frame (note: this can provide a good still image of a quickly shifting frame without any shifting of the still image), the trace path of head 106 on tape 100 falls outside field track 140b, as indicated by area 144 in FIG. 10A. This is inevitably caused by a difference between a tape speed in the recording mode and that in the still reproduction mode. Since head 106 reproduces only field track components having the same azimuth angle as itself, an overlapping region of trace area 144 and field track 140b becomes a reproduction enable region of an effective video signal, and the remaining regions of trace area 144 (i.e., regions overlapping A field tracks at two sides of track 140b) serves as noise generating regions. As a result, noise (so-called "bar-noise") components are generated in the reproduced frame image in the still or slow reproduction mode, thus impairing image quality in these special reproduction modes.

Figure 10B:
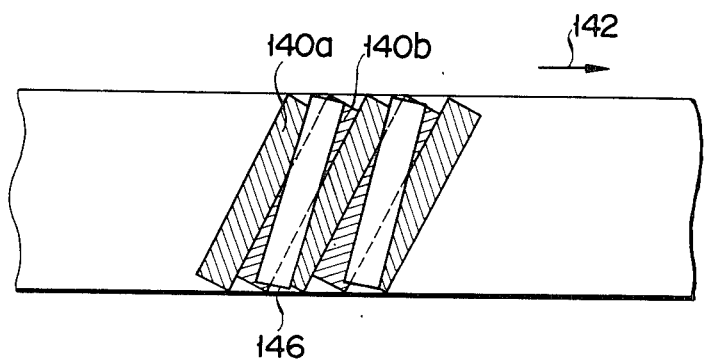

Since the tape running speed in the double-speed reproduction or high-speed picture search mode is higher than that in the normal recording/reproduction mode, the angle of inclination of the trace path of head 106 on tape 100 (indicated by area 146 in FIG. 10B) becomes larger than that of field track 140b, as shown in FIG. 10B. As a result, the trace path of head 106 on tape 100 is shifted from track 140b, as shown in FIG. 10B. Therefore, noise components corresponding to the above shift are also undesirably included in the reproduced image. As such trace shifting is increased, the bar-noise components also increase, thus degrading the S/N (signal-to-noise) ratio of the reproduced image.

In this embodiment, however, since magnetic head 106 is displaced on rotating drum 102 to compensate for a shift in the actual trace path of head 106 with respect to the field track in the slow or still reproduction mode, it can reliably trace the field track defined on tape 100. More specifically, generator 116 produces triangular-wave voltage signal 130 of an amplitude corresponding to the designated special reproduction mode (FIG. 11A) in response to mode designation signal 128 from mode designator 126. Signal 130 is synthesized with tracking error signal 120, and is transferred to differentiator 122. Signal 130 therefore has a waveform defining a vibration mode of actuator 108 which is necessary for compensating for a shift between the trace path of head 106 and the actual field track, when head 106 runs at a speed corresponding to the designated special reproduction mode.

In response to the output signal from differentiator 122, as shown in FIG. 11C, constant current supply 124 supplies to actuator 108 a drive current signal having a waveform obtained by differentiating the voltage waveform in FIG. 11A. If the voltage applied to actuator 108 is detected under this condition, a voltage waveform whose voltage level changes to compensate for the hysteresis characteristics of vibrating actuator 108 can be obtained. As a result, vibrating head 106 can run at the same speed in each direction and can more precisely trace the corresponding field track.

In the above embodiment, head 106 is attached to the free end of actuator 108. However, as shown in FIG. 12, two opposing magnetic heads 150 and 152 arranged on the annular circumferential surface of a rotating drum (not shown in FIG. 12) can be attached to two ends of single piezoelectric actuator 154. In this case, actuator 154 is fixed at its central portion to a predetermined inner portion of the rotating drum by support member 156. With this arrangement, two heads 150 and 152 are vibrated by actuator 154 in a direction indicated by the arrows in FIG. 12. Furthermore, ring-shaped piezoelectric actuator 158 shown in FIG. 13A can be used. Actuator 158 is installed in a rotating drum. Two magnetic heads 160 and 162 are mounted on two opposing portions of actuator 158. Support members 164 and 166 are arranged on other two opposing portions of actuator 158 so as to fix actuator 158 to the rotating drum. FIG. 13B is a side view of the head arrangement in FIG. 13A. With this arrangement, two heads 160 and 162 are vibrated by actuator 158 in a direction indicated by the arrows.

Figure 14:
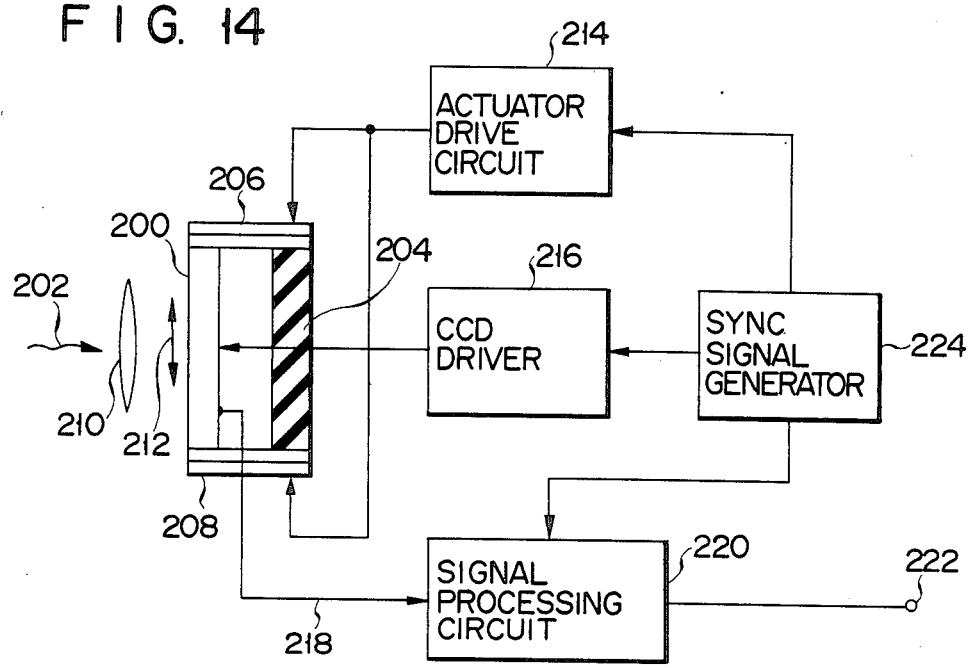
FIG. 14 is a block diagram showing a schematic arrangement of a main part of an image sensing device (second application) incorporating a displacement generating device of the present invention.

FIG. 14 shows an image sensing device including a swing CCD using the displacement generating device of this invention. In this image sensing device, solid state image sensor (e.g., an interline transfer type charge-coupled device; to be referred to as IT-CCD hereinafter) 200 vibrates or swings in response to incident image light 202 during an image sensing operation, so that a high-resolution image with twice as many pixels as are actually present can be reproduced.

IT-CCD 200 is arranged on fixed base member 204 through two bimorph piezoelectric actuators 206 and 208 to be parallel thereto and separated therefrom by a given distance. When actuators 206 and 208 vibrate, IT-CCD 200 swings (i.e., periodically displaces) in a direction indicated by arrow 212 in response to image light 202, which is radiated onto its photosensing region through lens 210, thus performing an imaging operation.

Actuator drive circuit 214 is connected to actuators 206 and 208, and includes a drive voltage signal generator, a differentiator, and a constant current supply, just as previously described, and a detailed illustration thereof is omitted from FIG. 14. CCD driver 216 is connected to IT-CCD 200, and produces a CCD drive signal containing a gate control signal for controlling an imaging operation of IT-CCD 200 (e.g., a signal readout operation, a charge transfer operation, and the like). Imaging output 218 generated by the imaging operation of IT-CCD 200 is supplied to signal processing circuit 220 for reproduction processing, and is then sent to an external circuit (not shown) through output terminal 222. Sync signal generator 224 produces a sync signal for synchronizing circuits 214, 216, and 220. Therefore, a CCD drive operation, vibration drive control for the piezoelectric actuators, and signal processing operation for image reproduction are appropriately performed in response to the sync signal.

Figure 15:
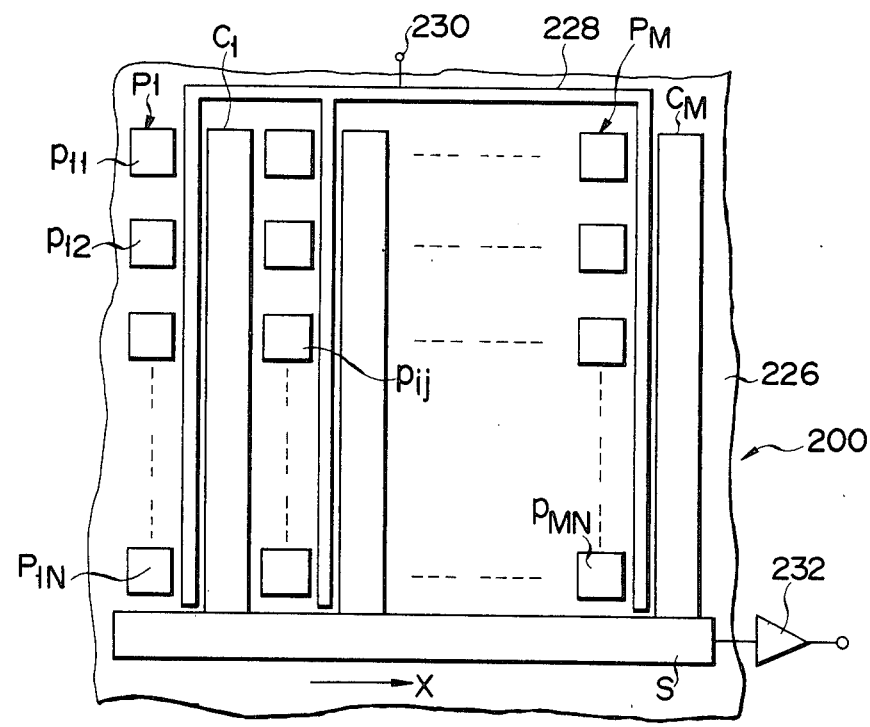
FIG. 15 is a plan view showing an interline transfer type charge-coupled device used in the device in FIG. 14.

IT-CCD 200 has a photosensing region having $N \times M$ (e.g., $N=500$, $M=400$) photosensing elements (i.e., photodiodes P11, P12, Pij, . . . , PMN) P, as shown in FIG. 15. Photodiodes P are arranged on CCD substrate 226 in a matrix. M vertical CCDs Cl to CM are arranged adjacent and opposite to corresponding M photodiode arrays Pl to PM. Vertical CCDs Cl to CM are connected to horizontal shift register S at their final transfer stages, respectively. Field shift gate (to be referred to as "FSG" hereinafter) 228 is formed to have gate portions extending between adjacent ones of vertical photodiode arrays (i.e., vertical pixel arrays) Pl to PM and vertical CCDs Cl to CM. When the gate control signal is supplied to FSG 228 from CCD driver 216 (FIG. 14) through gate terminal 230, a signal charge accumulated in photodiodes P upon light irradiation is transferred to vertical CCDs Cl to CM. The signal charge transferred to CCDs Cl to CM is then sequentially transferred to CCD shift register S. The signal charge in register S is sequentially transferred in horizontal direction X, thus obtaining the CCD output signal. The output signal from IT-CCD 200 is output from output terminal 222 through amplifier 232 and circuit 220.

FIG. 16 shows horizontal cell array 240 in which a plurality of pixel regions in IT-CCD 200 of FIG. 15 are arranged horizontally for explaining a swing mode of IT-CCD 200. In FIG. 16, layer 242 is an aluminum electrode for shielding incident light. Aluminum electrode 242 has rectangular opening 244, and photodiode Pij corresponding to a single image sensing cell is arranged below opening 244. Electrode 242 defines each cell region, and optically isolates two adjacent photodiodes P.

Swing IT-CCD 200 with the above arrangement performs the following imaging operation by means of piezoelectric actuators 206 and 208. In order to allow easy understanding of the swing imaging operation of CCD 200, displacement of cell Pij in a single frame period (based on the NTSC system) consisting of two field periods will be explained with reference to FIG. 16. As shown in FIG. 16, IT-CCD 200 is swing-driven by actuators 206 and 208 in horizontal scanning direction X relative to incident light 202, so that cell Pij is located at two different sampling positions X1 and X2 in two field periods ta1 and tb1 in one frame period tF1, respectively, as shown in FIG. 16. More specifically, each cell Pij is placed at first sampling position X1 in first (A) field period ta1 in frame period tF1 in synchronism with a vertical sync pulse signal (illustrated at the right of FIG. 16 and in FIG. 17A) defining each field period, and is fixed in position during period ta1, thus performing image sensing. In second (B) field period in frame period tF1, cell Pij is displaced from position X1 to X2, and is fixed in position during period tb1 for image sensing. Subsequently, in next frame period tF2, cell Pij again returns from position X2 to X1, and thereafter repeats its displacement. A vibration amplitude of cell Pij is set to be half of pitch PH (PH/2) of two horizontally adjacent cells. Therefore, it can be considered equivalent that the number of sampling positions in swing IT-CCD 200 is twice as many as the actual number of pixels (arranged at equal pitch). As a result, a resultant image having a horizontal resolution corresponding to the doubled original pixel number can be obtained. If periodical displacement of the cell is represented as a graph, it corresponds to rectangular waveform illustrated at the center of FIG. 16.

A drive voltage signal from circuit 214 for driving actuators 206 and 208 has a rectangular waveform, as shown in FIG. 17B, and is adopted in the above-mentioned swing imaging operation. This rectangular-wave voltage signal can be obtained from the drive voltage generator in circuit 214 in synchronism with the vertical sync pulse signal. The voltage signal is converted by the differentiator and the constant current supply into a drive current signal (FIG. 17D) having a waveform obtained by differentiating the voltage signal of FIG. 17B, and is then supplied to actuators 206 and 208. When the voltage applied to actuators 206 and 208 is detected under this condition, a voltage waveform whose voltage level changes to compensate for the hysteresis characteristics of the vibrating actuators can be obtained. During this swing imaging operation, vibration of IT-CCD 200 can be free from its hysteresis characteristics, thus being linear. Therefore, displacement of IT-CCD 200 in periods ta and tb can be performed uniformly, thus improving efficiency and stability in the swing imaging operation. As a result, an S/N ratio of the CCD imaging output signal obtained in the swing imaging mode can be increased, resulting in an improvement in resultant image quality. Furthermore, since drive circuit 214 has a simple arrangement, it can be easily installed in an image sensing device which is normally formed on one chip. This is a significant advantage inherent in the present invention.

Although the present invention has been shown and described with reference to particular embodiments, various changes and modifications which are obvious to a person skilled in the art to which the invention pertains are deemed to lie within the scope of the invention.

In the above embodiments, the signal waveform is differentiated by differentiator 14 to coincide with the displacement waveform. As another method, if a desired displacement waveform differentiated by a programmable signal generator is input to a constant current circuit, the same effects as above can be obtained.

What is claimed is:

1. A displacement generating device comprising:
   (a) a piezoelectric element;
   (b) voltage generating means for producing a drive voltage whose potential level changes to define a vibration mode of said piezoelectric element; and
   (c) current control means, connected to said voltage generating means and said piezoelectric element, for receiving the drive voltage to produce a current signal containing a constant current component which changes a charge amount accumulated in said piezoelectric element to coincide with a change in potential level of the drive voltage, whereby displacement generated in said piezoelectric element changes linearly to coincide with the waveform of the drive voltage and is free from hysteresis, said current control means comprising, first circuit means for differentiating the drive voltage to produce a differentiated voltage signal, and second circuit means for producing a current signal having two constant current levels at two different potentials corresponding to changes in the potential level of the drive voltage in response to the differentiated voltage signal, said second circuit means having a resistor connected to said piezoelectric element for discharging charge accumulated therein.

2. The device according to claim 1, wherein said current control means comprises:
   first circuit means, connected to said voltage generating means, for differentiating the drive voltage to produce a differentiated voltage signal; and
   second circuit means, connected to said first circuit means, for producing a current signal having two constant current levels at two different potentials corresponding to an increase or decrease in the potential level of the drive signal in response to the differentiated voltage signal, whereby the amount of charge accumulated in said piezoelectric element varies linearly in proportion to the drive voltage, so that displacement of said piezoelectric element changes linearly.

3. The device according to claim 1, wherein said voltage generating means includes a voltage signal generator for providing a triangular-wave drive voltage signal.

4. The device according to claim 3, wherein said first circuit means includes a differentiator which differentiates the triangular-wave drive voltage signal to produce a rectangular-wave voltage signal synchronous therewith, from an output terminal thereof.

5. The device according to claim 4, wherein said second circuit means includes a constant current supply circuit for producing a rectangular-wave current signal which coincides with the waveform of the rectangular-wave voltage signal from said differentiator.

6. The device according to claim 5, wherein said constant current supply circuit comprises:
   a first operational amplifier having an inverting input connected to a ground potential, a non-inverting input connected to the output terminal of said differentiator, and a current output, said piezoelectric element being connected between the current output and the inverting input of said operational amplifier.

7. The device according to claim 6, wherein said differentiator comprises:
   a second operational amplifier having an inverting input connected to a ground potential, a non-inverting input connected to said voltage signal generator, and a voltage output connected to the non-inverting input of said first operational amplifier; and
   a feedback resistor connected between the non-inverting input and the voltage output of said second operational amplifier.

8. A displacement generating device to be used for a helical scan type video data reproduction apparatus which reproduces a magnetically prerecorded video signal on a running magnetic tape using at least one magnetic head arranged on a drum which is helically rotatable with respect to the running magnetic tape, said displacement generating device comprising:
   (a) a piezoelectric element, arrange in said drum and supporting said magnetic head, for displacing said magnetic head on said drum;
   (b) voltage generating means for producing a drive voltage whose potential level changes to define a vibration mode of said piezoelectric element which displaces said magnetic head on said drum to compensate for a difference, occuring in a special reproduction mode of said video data reproduction apparatus, between a field track defined on said tape and a trace path of said magnetic head on said magnetic tape running at a speed different from that in a normal mode; and
   (c) current control means, connected to said voltage generating means and said piezoelectric element, for receiving the drive voltage to produce a current signal containing a constant current component which changes an amount of charge accumulated in said piezoelectric element to coincide with a change in potential level of the drive voltage, and for linearly changing displacement of said piezoelectric element to coincide with the waveform of the drive voltage independently of a change in the drive voltage, so that said magnetic head can trace the field track in the special reproduction mode, said current control means comprising,
   first circuit means for differentiating the drive voltage to produce a differentiated voltage signal, and
   second circuit means for producing a current signal having two constant current levels at two different potentials corresponding to changes in the potential level of the drive voltage in response to the differentiated voltage signal, said second circuit means having a resistor connected to said piezoelectric element for discharging charge accumulated therein.

9. The device according to claim 8, wherein said voltage generating means comprises a voltage signal generator for producing a triangular-wave drive voltage signal.

10. The device according to claim 9, wherein first and second circuit means comprises:
   a differentiator, connected to said voltage signal generator, for differentiating the triangular-wave drive voltage signal to produce a rectangular-wave voltage signal synchronous with the triangular-wave drive voltage signal from an output terminal thereof; and
   a constant current supply circuit, connected to said differentiator, for producing, in response to the differentiated voltage signal, a rectangular-wave current signal having two constant current levels of two different potentials corresponding to an increase and a decrease in the potential level of the drive voltage and having the same phase as that of the rectangular-wave voltage signal from said differentiator, whereby an amount of charge accumulated in said piezoelectric element varies linearly in proportion to the drive voltage, so that displacement of said piezoelectric element changes linearly.

11. A displacement generating device to be used for an imaging device including an image sensor which periodically displaces with respect to incident image light so as to be placed at different sampling positions in field periods included in one frame period of an imaging mode, said displacement generating device comprising:
   (a) a piezoelectric element for generating displacement which mechanically swings said image sensor;
   (b) voltage generating means for producing a drive voltage whose potential level changes to define a swing mode of said image sensor; and
   (c) current control means, connected to said voltage generating means and said piezoelectric element, for receiving the drive voltage to produce a current signal containing a constant current component which changes an amount of charge accumulated in said piezoelectric element to coincide with a change in potential level of the drive voltage, whereby displacement of said piezoelectric element changes to coincide with the waveform of the drive voltage, so that said image sensor displaces periodically between the sampling positions in the one frame period.

12. The device according to claim 11, wherein said voltage generating means comprises a voltage signal generator for producing a drive voltage signal having a rectangular waveform synchronous with a vertical sync signal supplied to said image sensor.

13. The device according to claim 12, wherein said current control means comprises:
   a differentiator, connected to said voltage signal generator, for differentiating the rectangular-wave drive voltage signal to produce a differentiated voltage signal from an output terminal thereof; and
   a constant current supply circuit, connected to said differentiator, for producing, in response to the differentiated voltage signal, a rectangular-wave current signal having two constant current levels of two different potentials corresponding to an increase and a decrease in the potential level of the drive voltage and having the same phase as that of the rectangular-wave voltage signal, whereby an amount of charge accumulated in said piezoelectric element varies linearly in proportion to the drive voltage, so that displacement of said piezoelectric element changes linearly.

14. The device according to claim 11, wherein said voltage generating means comprises sync signal generator means for producing a vertical sync signal supplied to said image sensor.

15. The device according to claim 14, wherein said current control means comprises:
   a constant current supply circuit for producing, in response to the vertical sync signal, a substantially rectangular-wave current signal having two constant current levels of two different potentials corresponding to an increase and a decrease in the potential level of the drive voltage, whereby an amount of charge accumulated in said piezoelectric element varies linearly in proportion to the drive voltage, so that displacement of said piezoelectric element changes linearly.

16. The device according to claim 1, wherein said second circuit means produces the current signal having two constant current levels at two different potentials corresponding to an increase and a decrease in the potential level of the drive voltage, and for linearly varying the amount of charge accumulated in said piezoelectric element linearly changes.

* * * * *